United States Patent
Bao et al.

(10) Patent No.: US 7,470,574 B2
(45) Date of Patent: Dec. 30, 2008

(54) OFET STRUCTURES WITH BOTH N- AND P-TYPE CHANNELS

(75) Inventors: Zhenan Bao, Stanford, CA (US); Evert-Jan Borkent, Groningen (NL); Dawen Li, Ann Arbor, MI (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 543 days.

(21) Appl. No.: 11/330,472

(22) Filed: Jan. 12, 2006

(65) Prior Publication Data
US 2006/0138406 A1   Jun. 29, 2006

Related U.S. Application Data

(62) Division of application No. 10/875,478, filed on Jun. 24, 2004, now Pat. No. 7,045,814.

(51) Int. Cl.
*H01L 21/00* (2006.01)
*H01L 21/84* (2006.01)
(52) U.S. Cl. .................. 438/157; 438/99; 257/E21.179
(58) Field of Classification Search .............. 438/82, 438/99, 157, 176, 195, 283; 257/40, 250, 257/331, 406, E21.179
See application file for complete search history.

(56) References Cited

U.S. PATENT DOCUMENTS 4,021,835 A * 5/1977 Etoh et al. ................. 257/404
5,118,632 A * 6/1992 Schrantz ..................... 438/194
6,278,127 B1   8/2001 Dodabalapur et al.
7,145,174 B2 * 12/2006 Chiang et al. ................. 257/59
2005/0056828 A1 * 3/2005 Wada et al. ................... 257/40

OTHER PUBLICATIONS

J.S. Meth, et al.; "Dual Insulated-Gate Field-Effect Transistors With Cadmium Sulfide Active Layer and a Laminated Polymer Dielectric"; 2004 American Institute of Physics; Applied Physics Letters, vol. 84, No. 15; pp. 1-3.

* cited by examiner

Primary Examiner—Davienne Monbleau
Assistant Examiner—Dilinh P Nguyen

(57) ABSTRACT

The present invention provides a dual organic field-effect transistor (OFET) structure and a method of fabricating the structure. The dual OFET structure includes an n-type organic semiconductor layer and a p-type organic semiconductor layer in contact with each other along an interface and forming a stack. The dual OFET structure also includes a source electrode and a drain electrode, the source and drain electrodes being in contact with one of the organic semiconductor layers. The dual OFET structure further includes first and second gate structures located on opposite sides of the stack. The first gate structure is configured to control a channel region of the n-type organic semiconductor layer, and the second gate structure is configured to control a channel region of the p-type organic semiconductor layer.

9 Claims, 13 Drawing Sheets

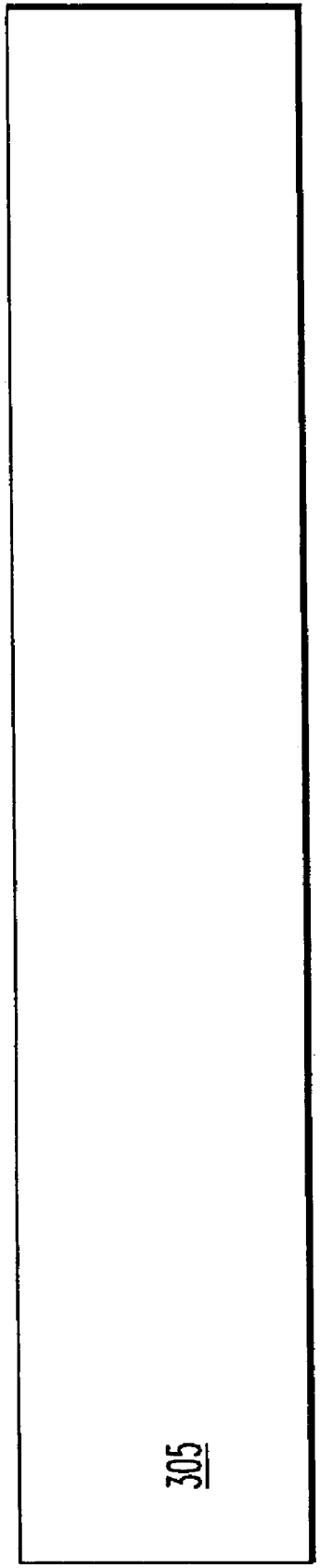

OFET STRUCTURES WITH BOTH N- AND P-TYPE CHANNELS

This Application is a Divisional of prior application Ser. No. 10/875,478 filed on Jun. 24, 2004, now U.S. Pat. No. 7,045,814 to Zhenan Bao, et al. The above-listed Application is commonly assigned with the present invention and is incorporated herein by reference as if reproduced herein in its entirety under Rule 1.53(b).

The U.S. Government has a paid-up license in this invention and the right, in limited circumstances, to require the patent owner to license others on reasonable terms as provided for by the terms of Advanced Technology Program Cooperative Agreement No. 70NANB2H3032 awarded by the National Institute of Standards and Technology.

TECHNICAL FIELD OF THE INVENTION

The present invention is directed, in general, to structures and processes for fabricating organic field effect transistors (OFETs).

BACKGROUND OF THE INVENTION

There is growing interest in the use of OFETs in device structures, where an active channel of the transistor is made from an organic semiconductive material. OFETs can be manufactured in fewer steps, using less expensive materials, than transistors based on silicon technologies. One desirable application for OFETs is dual transistor structures, such as an inverters. Inverters are fundamental to many electronic devices, including logic devices, ring oscillators, and other devices well known to skilled in the art.

A conventional inverter has one n-type transistor and one p-type transistor in a side-by-side arrangement. The fabrication of a conventional inverter made from OFETs therefore requires two separate processes to fabricate the n-type OFET and the p-type OFET. The use of two separate processing schemes for each type of OFET increases the expense and complexity to fabricate the inverter. In addition, a side-by-side arrangement of transistors occupies an undesirably large area, making device miniaturization difficult.

The present invention overcomes these problems by providing a simplified processing scheme to form a stacked pair of OFETs, resulting in a novel dual transistor structure.

SUMMARY OF THE INVENTION

The present invention benefits from the realization that one set of electrodes can be used as the source and drain in both p-type and n-type OFETs. Because the organic semiconductor layers of the OFETs are formed into a stack, and the electrodes contact one of the layers, device fabrication is simplified, and the dual OFET structure is more compact than a side-by-side dual transistor structure.

One embodiment of the present invention provides a dual OFET structure. The OFET structure comprises an n-type organic semiconductor layer and a p-type organic semiconductor layer in contact with each other along an interface and forming a stack. The OFET structure also has a source electrode and drain electrode and first and second gate structures. The source and drain electrodes are in contact with one of the organic semiconductor layers. The first gate structure and the second gate structure are located on opposite sides of the stack. The first gate structure is configured to control a channel region of the n-type organic semiconductor layer, and the second gate structure is configured to control a channel region of the p-type organic semiconductor layer.

In another embodiment, the invention further provides a method for fabricating a dual OFET structure. The method comprises forming a first gate structure on a substrate and forming a stack over the first gate structure and over the substrate. The stack includes a p-type organic semiconducting layer and an n-type organic semiconducting layer, the organic semiconducting layers being in contact along an interface. The method also includes forming source and drain electrodes and forming a second gate structures on an opposite side of the stack. The source and drain electrodes are in contact with one of the semiconductor layers.

BRIEF DESCRIPTION OF THE DRAWINGS

The invention is best understood from the following detailed description, when read with the accompanying FIGURES. Various features may not be drawn to scale and may be arbitrarily increased or reduced for clarity of discussion. Reference is now made to the following descriptions taken in conjunction with the accompanying drawings, in which:

FIGS. 3A to 3K schematically illustrate detailed sectional views of selected steps in an exemplary method of fabricating a dual organic field effect transistor structure.

DETAILED DESCRIPTION

The present invention benefits from the discovery that a single set of electrodes can be used as the source and drain electrodes for both p-type and n-type organic semiconductors in a dual OFET structure. It is surprising that one can use electrodes that are separated from one of the organic semiconductor layers by another organic semiconductor layer of a different conduction type. Conventional wisdom predicts that there could be an unacceptably high energy barrier for injecting a charge carrier from a source electrode through the organic semiconductor layer of the opposite type between the electrodes and the other organic semiconductor layer.

Figure 1:
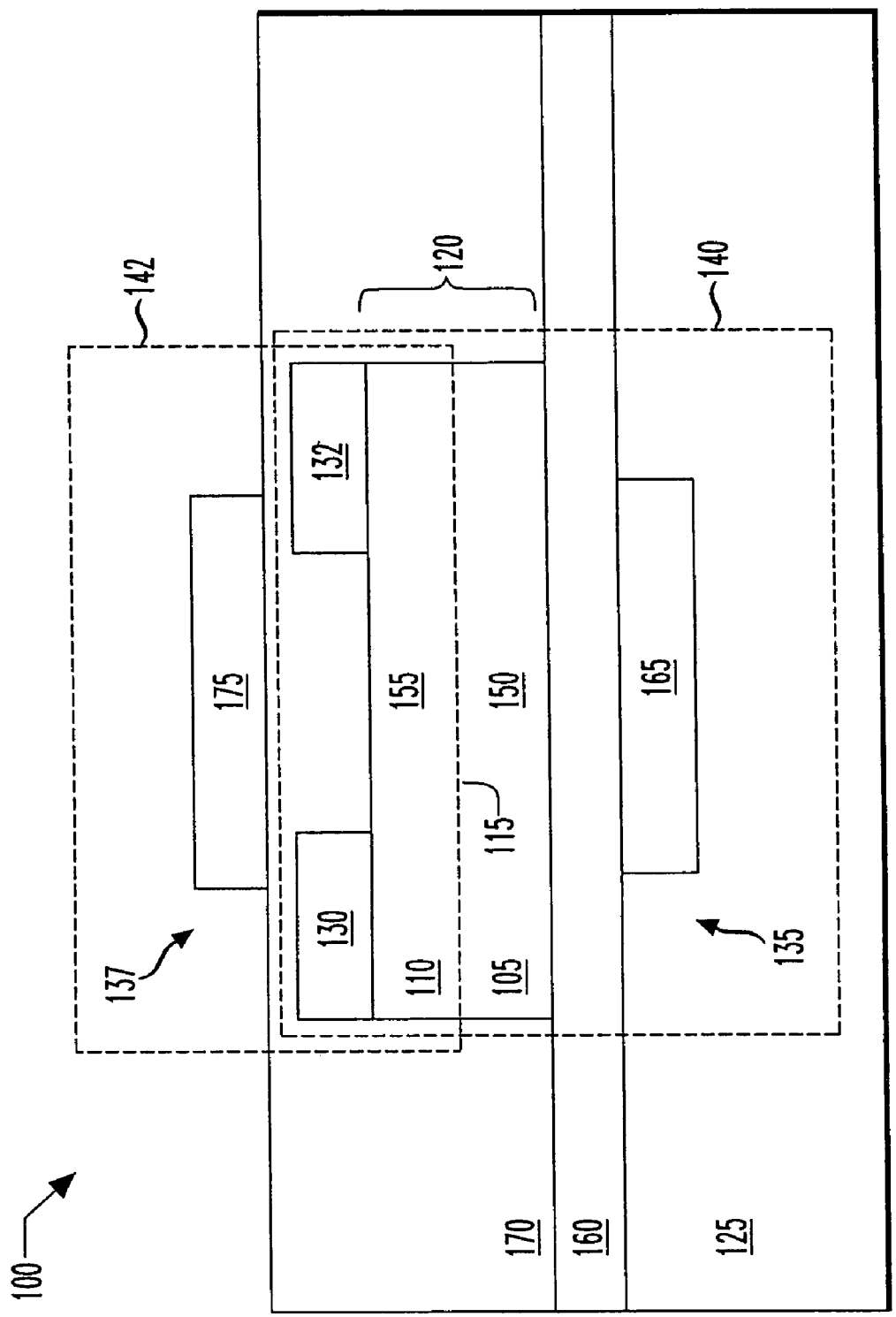
FIG. 1 illustrates a detailed sectional view of a dual organic field effect transistor structure embodying the principles of the present invention.

FIG. 1 illustrates a cross sectional view of a portion of an exemplary dual OFET structure 100 that embodies the principles of the present invention. The dual OFET 100 structure can be used in any number of applications, such as biosensors, integrated circuits, displays, logic devices and memory devices. The dual OFET structure 100 comprises an n-type organic semiconductor layer 105 and a p-type organic semiconductor layer 110 in contact along an interface 115 and forming a stack 120, over a substrate 125. The structure 100 further includes source and drain 130, 132 in contact with one of the organic semiconductor layers 105, 110. The structure 100 also has first and second gate structures, 135, 137 located on opposite sides of the stack 120. The first gate structure 135 is configured to control a channel region 150 of the n-type organic semiconductor layer 105, and the second gate structure 137 is configured to control a channel region 155 of the p-type organic semiconductor layer 110. One of the source and drain electrodes 130, 132 is a source or drain electrode for the channel 155 in the p-type semiconductor layer 110 and for a channel 150 in said n-type semiconductor layer 105.

For the embodiment shown in FIG. 1, the source and drain 130, 132 contact only the p-type organic semiconductor layer 110. The one organic semiconductor layer 110 that contacts the source and drain 130, 132 is between the other organic semiconductor layer 105 and the source and drain 130, 132. Of course, in other embodiments, the source and drain 130, 132 may contact only the n-type organic semiconductor layer 105. Such is the case when, for example, the locations of the n-type and p-type organic semiconductor layers 105, 110 are reversed as compared to that depicted in FIG. 1. Alternatively, the source and drain 130, 132 could be located between the n-type organic semiconductor layer 105 and the substrate 125.

The dual OFET structure 100 shown in FIG. 1 presents a top contact dual OFET. Such a configuration is desirable because it facilitates the formation of electrical contacts with the source and drain electrodes 130, 132. In such a configuration, the organic semiconductor layers 105 110 are between the substrate 125 and the source and drain 130, 132. Other embodiments use a bottom contact OFET structure, where the source and drain 130, 132 are between the substrate 125 and the semiconductor layers 105 110. Such embodiments are desirable because a wide variety of methods can be used to form the source and drain 130, 132 without the concern of degrading the organic semiconductor layers 105, 110.

It is advantageous to provide the organic semiconductor layers 105, 110 as a stack 120, which is vertical over the substrate 125 as shown in FIG. 1. The organic semiconductor layers 105, 110 are each part of an n-type and a p-type OFET 140, 142, respectively. Because the organic semiconductor layers 105, 110 are stacked, the OFETs 140, 142 are also stacked, resulting in a more laterally compact dual OFET structure 100 as compared to a conventional side-by-side dual transistor structure.

As further explained below, the stack 120 is preferably formed by sequentially depositing the organic semiconductor layers 105, 110 in the same processing scheme. Preferably, the n-type organic semiconductor layer 105 and the p-type organic semiconductor layer 110 have substantially a same footprint, that is, they are laterally coextensive as shown. This, in turn, allows better registration of the OFETs 140, 142 with each other as compared to separately manufacturing two OFETs and laminating them together.

It is advantageous for the interface 115 between the n-type and p-type organic semiconductor layers 105, 110 to be smooth, because this facilitates the conduction of charge carriers through the interface 115, thereby reducing contact resistance. For instance, since organic semiconductor layer 110 lays on top of organic semiconductor layer 105, a rough top surface of layer 105 will result in small grain growth and rough top surface of layer 110, both of which will lead to lower charge transport mobility of layer 110. In some embodiments, the interface 115 preferably has a surface roughness of less than about 50 nanometers, and more preferably less than about 5 nanometers. In other preferred embodiments, the interface 115 preferably has a grain size of at least about 50 nanometers. One of ordinary skill in the art would know how to measure the surface roughness and grain size of organic semiconductor materials, using atomic force microscopy, or other conventional techniques.

If the first-deposited organic semiconductor layer acts as an epitaxial growth surface for the second deposited organic semiconductor layer, the first surface will impart its roughness to the second-deposited organic semiconductor layer. Therefore, a smooth interface 115 is facilitated by selecting for first deposition, the one organic semiconductor layer 105, 110 that would provide a lower surface roughness and larger grain size. In some cases, the n-type organic semiconductor layer 105 comprises a fluorinated copper phthalocyanin (FCuPc), such as copper hexadecafluorophthalocyanine, and the p-type organic semiconductor layer 110 comprises pentacene. It may be advantageous for the FCuPc containing layer 105 to be deposited first, because FCuPc has a lower surface roughness than pentacene.

The organic semiconductor layers 105, 110 can be made of any conventional n-type or p-type organic semiconducting materials, respectively. Non-limiting examples include: oligophenyl compounds or combinations of different benzoid aromatic ring structures like benzene, napthalene or anthracene rings coupled to each other in a conjugated structure; nonbenzoid aromatic rings, heterocyclic rings, including oligothiophenes such as alpha-sexithiophene; or co-oligomers of these structures, such as co-oligo (bithiophenefluorene), co-oligo(bithiopheneanthracene). The choice of which material to deposit first will depend on the relative surface roughness and grain size of the materials selected for the n-type and p-type organic semiconductor layer 105, 110, as well as other design considerations, such as the material's resistance to humidity.

As further illustrated in FIG. 1, the first gate structure 135 includes a first gate dielectric layer 160 between a first gate electrode 165 and the n-type organic semiconductor layer 105. Similarly, the second gate structure 137 can include a second gate dielectric layer 170 between a second gate electrode 175 the p-type organic semiconductor layer 110. The first and second gate electrodes 165, 175 can comprise metals, such as gold, silver, platinum, and palladium, conducting polymers, such as polyaniline or polythiophene that can be optionally doped to increase conductivity, or conductive ink comprising graphite and conducting polymers.

The gate dielectric layers 160, 170 can comprise any conventional insulating material used in transistor devices, including inorganic materials, such as silicon dioxide or aluminum oxide, organic materials, such as insulating organic polymers, or organic polymer/inorganic composites. In some instances polymers, such as polyimide or polymethylmethacrylate, can be deposited alone or in combination with titanium nanoparticles that serve to increase the dielectric constant of one or both of the gate dielectric layers 160, 170. See e.g., U.S. patent application Ser. No. 10/700,651, by Howard E. Katz et al., filed Nov. 4, 2003, and incorporated by reference herein in its entirety. In other cases, it is preferable to use an insulating material that can be deposited without degrading the already deposited organic semiconductor layers 105, 110. In some preferred embodiments, at least one of the gate dielectric layers 160, 170 comprise a poly-para-xylylene, such as parylene. In still other cases, at least one the gate dielectric layers 170 comprises silicon nitride deposited using a low temperature method. See e.g., U.S. patent application Ser. No. 09/789,397 by Kirk W. Baldwin et al., filed Feb. 21, 2001, and incorporated by reference herein in its entirety.

The total resistance of the n-type and p-type OFETs 140, 142 are influenced by the choice of materials used for the n-type and p-type organic semiconductor layers 105, 110, as well as the dimensions of the components of the OFETs 140, 142. For instance, when operating the n-type OFET 140 shown in FIG. 1, the charge carrier of electrons, is configured to travel from the source electrode 130, through the p-type organic semiconductor layer 110, and to the n-type organic semiconductor layer 105, thereby experiencing a contact resistance. The charge carrier further travels through the channel region 150 of n-type organic semiconductor layer 105, thereby encountering a channel resistance. The charge carrier then travels through the p-type organic semiconductor layer 110 to the drain electrode 132, experiencing further contact resistance. Analogous resistances are encountered when operating the p-type OFET 140 shown in FIG. 1, with the exception that the charge carrier of holes would travel through only the p-type organic semiconductor layer 110.

The thickness of the n-type organic semiconductor layer 105 and the thickness of the p-type organic semiconductor layer 110, influence the contact resistance of the OFETs 140, 142. Continuing with the example of operating the n-type OFET 140, an increase in thickness of the layer 110 increases the contact resistance while a decrease in thickness decreases the contact resistance. The magnitude of the gap between the source and drain 130, 132 similarly influences the channel resistance of the OFETs 140, 142. An increase in the gap increases the channel resistance while a decrease in the gap decreases the channel resistance.

In some dual OFET structures 100 it is advantageous for the channel resistance to be larger than the contact resistance, because such embodiments are conductive to a broad range of organic semiconductor layer thicknesses. For instance, in some preferred embodiments where the gap between the source and drain 130, 132 is at least about 100 microns, the thicknesses of the organic semiconductor layers 105, 110 are independently greater than about 5 nanometers and more preferably, from about 5 to about 40 nanometers. In other embodiments, where the gap is at least about 200 microns, the thickness of the organic semiconductor layers 105, 110 can independently range from about 5 to about 100 nanometers. It is preferred, however, that each of the organic semiconducting layers 105 be as thin as possible (e.g., about 5 to about 10 nanometers), so long as long as the layer is continuous without empty space between grains.

The current output of certain dual OFET structures 100 can be increased by adjusting the relative contact and channel resistance by changing the thicknesses of the organic semiconductor layers 105, 110, and the gap between the source and drain 130, 132. For example, a gap of less than about 100 microns, and more preferably between about 25 microns and about 100 microns, is conducive to an increased current output. In such embodiments, the thickness of the organic semiconductor layers 105, 110 are preferably less than about 5 nanometers and more preferably between about 2 nanometers and about 5 nanometers. As a further example, consider embodiments of the dual OFET structure 100, where the n-type-organic semiconductor layer 105 is made of FCuPc, the p-type organic semiconductor layer 110 is made of pentacene, and both layers 105, 110 have a thickness of about 20 nanometers. Decreasing the gap between the source and drain 130, 132 from about 50 microns to about 25 microns results in an increase in drive current from about 2 micro Amps to about 5 micro Amps.

Figure 2:
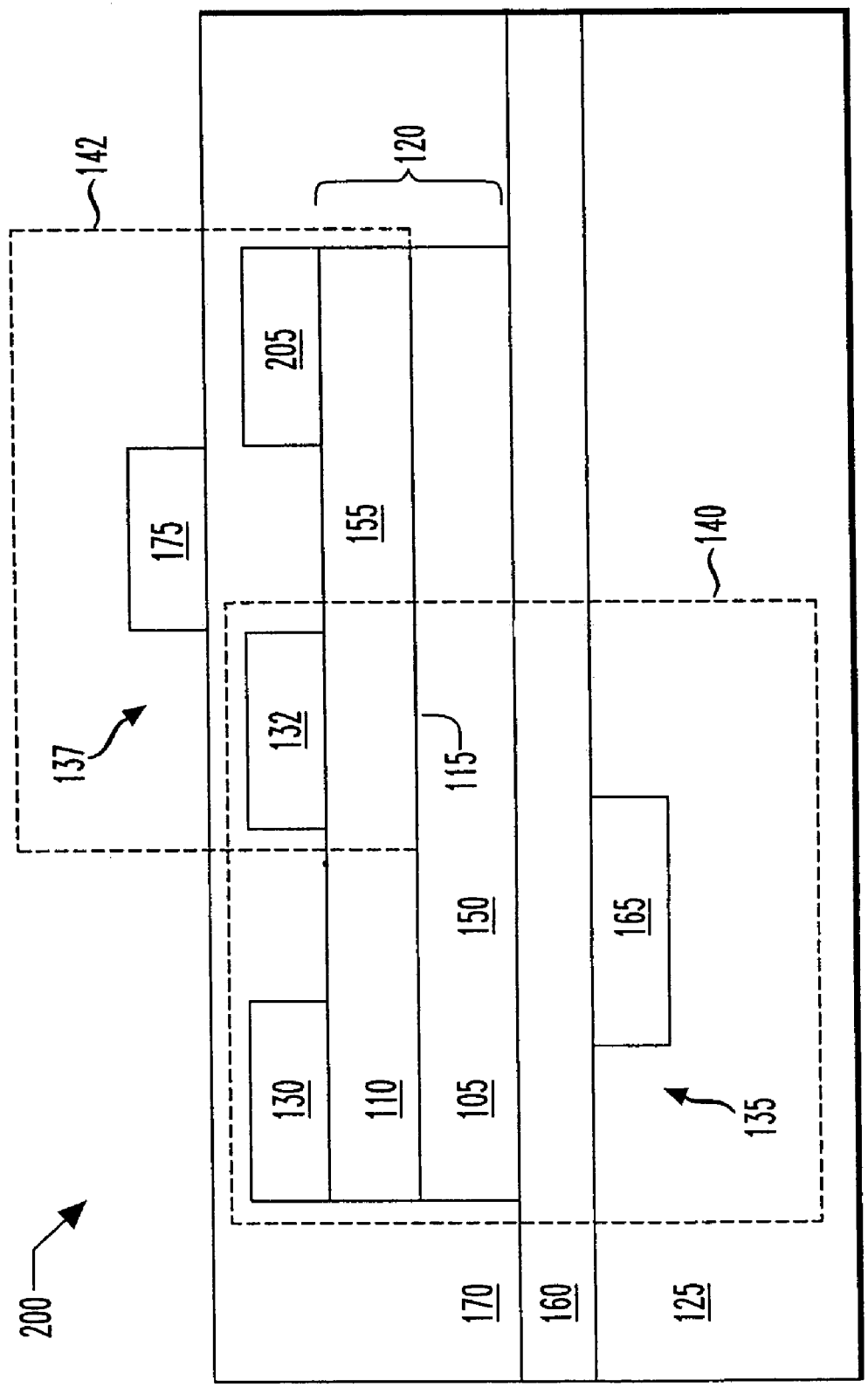
FIG. 2 illustrates a detailed sectional view of a dual organic field effect transistor structure embodying the principles of the present invention when configured as an inverter device.

FIG. 2 presents a sectional view of another dual OFET structure embodying the principles of the present invention when configured as an inverter device 200. Any of the embodiments of the dual OFET structure 100, shown in FIG. 1 and discussed above, can be incorporated into the inverter device 200. The same reference numbers are used to depict components of the inverter device 200 that are analogous to the components shown in FIG. 1. Although not presented, one of ordinary skill in the art would understand how to interconnect the n-type and p-type OFETs 140, 142, to provide a functional inverter device 200.

The inverter device 200 includes a third source or drain 205 in contact with the one organic semiconductor layer 110 that contacts the source and drain 130, 132. As illustrated in FIG. 2, the third source or drain 205 is a source electrode for the p-type OFET 142 with the n-type OFET 140 and p-type OFET 142 sharing a common drain 132. Of course, in other embodiments of the inverter device 200, the third source or drain 205 can be a drain electrode, with the n-type OFET 140 and p-type OFET 142 sharing a common source electrode.

With continuing reference to FIG. 2, the first gate structure 135 is configured to control the conductivity between the source 130 and the drain 132. The second gate structure 137 is configured to control conductivity between the drain 132 and the third source or drain 205. In the inverter device 200, the second gate structure 137 is not directly over the first gate structure 135. The first gate structure 135 is between the source and drain 130, 132, and the second gate structure 137 is between the drain 132 and the third source or drain 205. Such a configuration is conducive to the first and second gate structures 135, 137 being in independent control of the conductivities of the n-type and p-type channel regions 150, 155, respectively.

Figure 3B:
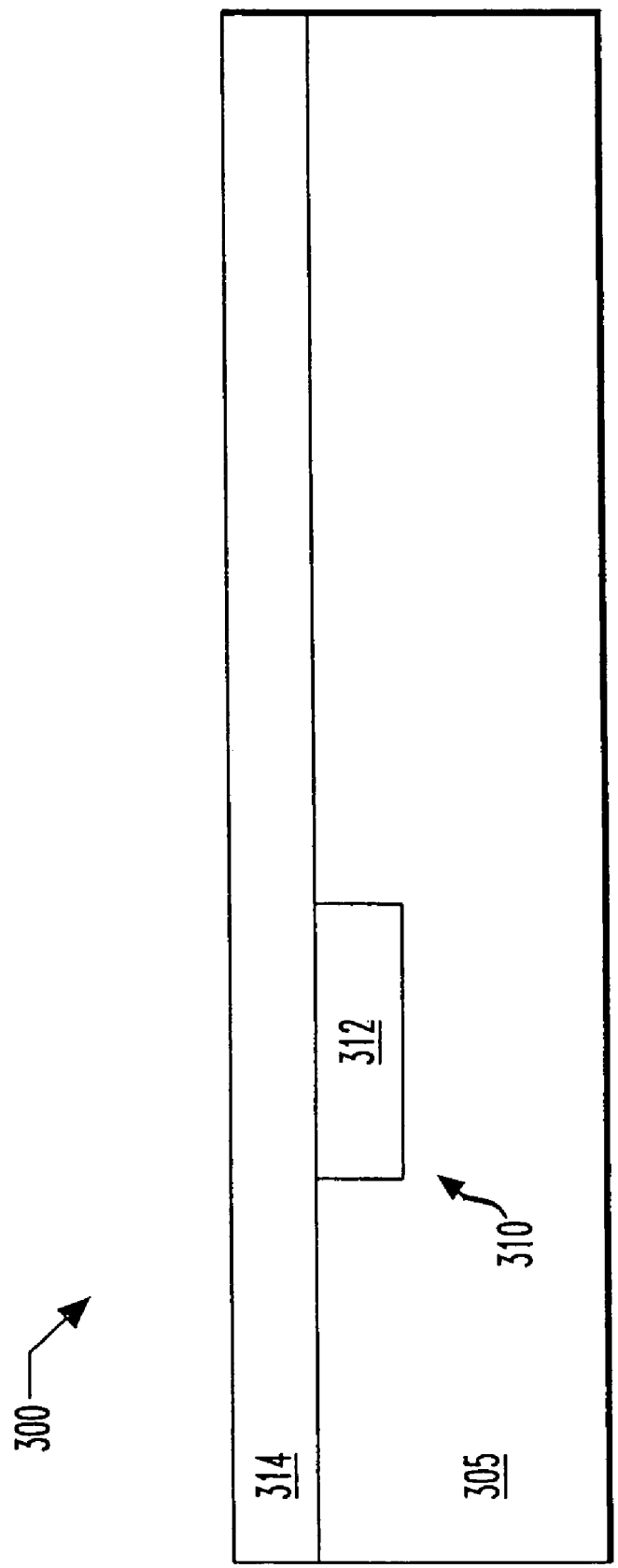

Turning now to FIGS. 3A to 3K, illustrated are selected steps in an exemplary method of the present invention of fabricating a dual OFET structure 300. Turning first to FIG. 3A, the method includes providing a substrate 305 comprising, for example, doped silicon, or other materials as described above. FIG. 3B shows the dual OFET structure 300 after forming a first gate structure 310, comprising a first gate electrode 312 and a first gate dielectric 314 over or on the substrate 305.

The first gate electrode 312 can comprise metals such as gold, deposited by conventional techniques like vacuum deposition, thermal evaporation or electron beam evaporation and patterned by conventional lithography to define the gate's structure. Alternatively, the first gate electrode 312 can be made of conducting polymers, such as polyaniline or polythiophene, using conventional techniques, such as ink jet printing, screen printing, or molding to form the gate's structure.

As noted above, the first-deposited first gate dielectric 314 can be formed by broad range of techniques, including depositing an inorganic layer, such as silicon oxide or aluminum oxide sputtered over the substrate 305, and preferably on the first gate electrode 312. The first gate dielectric 314 can also be formed by spin-coating insulating organic polymers or organic polymer/inorganic composites, or by chemical vapor deposition of the monomer or organic polymers, including poly-para-xylylenes, such as parylene, on the first gate electrode 312.

Figure 3C:
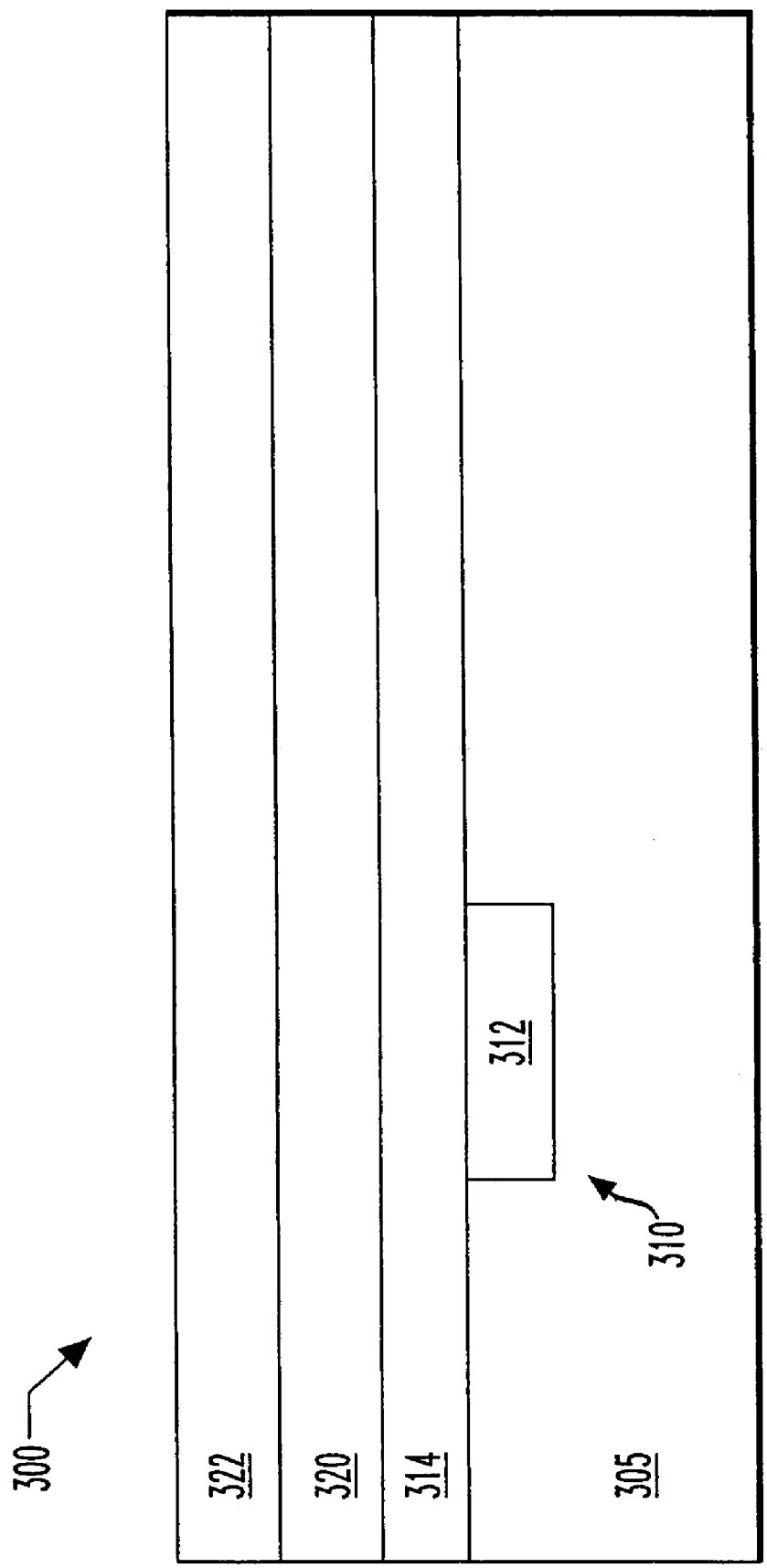

FIGS. 3C-3I illustrate various procedures that can be used to form a stack 315, comprising a p-type organic semiconducting layer 320 and an n-type organic semiconducting layer 322, over or on the first gate structure 310 and substrate 305. Turning now to FIG. 3C, the p-type organic semiconducting layer 320 and n-type organic semiconducting layer 322 are deposited over the substrate 305. The layers 320, 322 can be deposited using any number of conventional techniques including vacuum sublimation, spin-coating or dip-coating. Although the organic semiconducting layers 320, 322 can be deposited by different techniques, to simplify fabrication, it is preferable to sequentially deposit them using the same type of procedure.

Figure 3D:
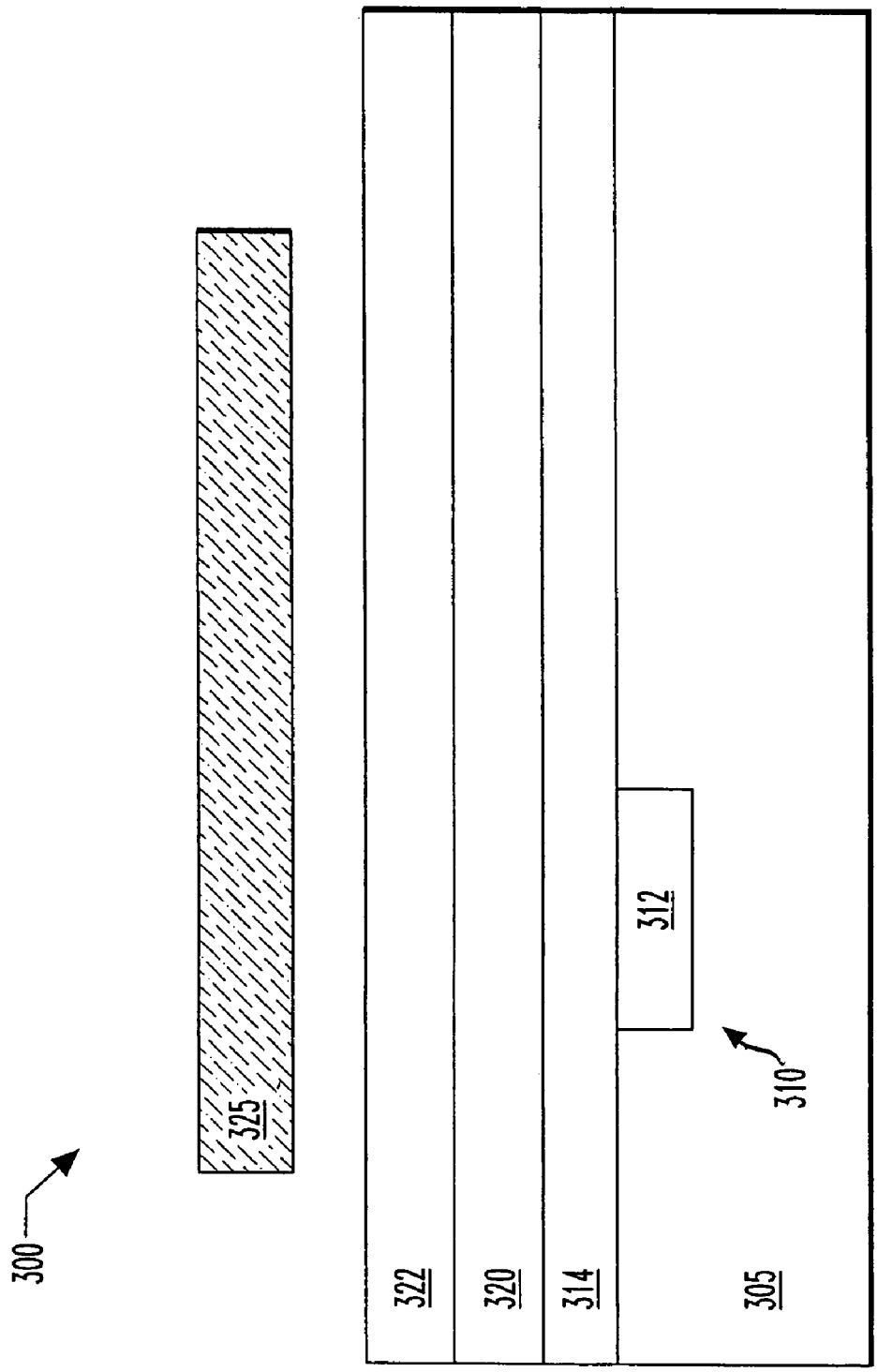
Figure 3E:
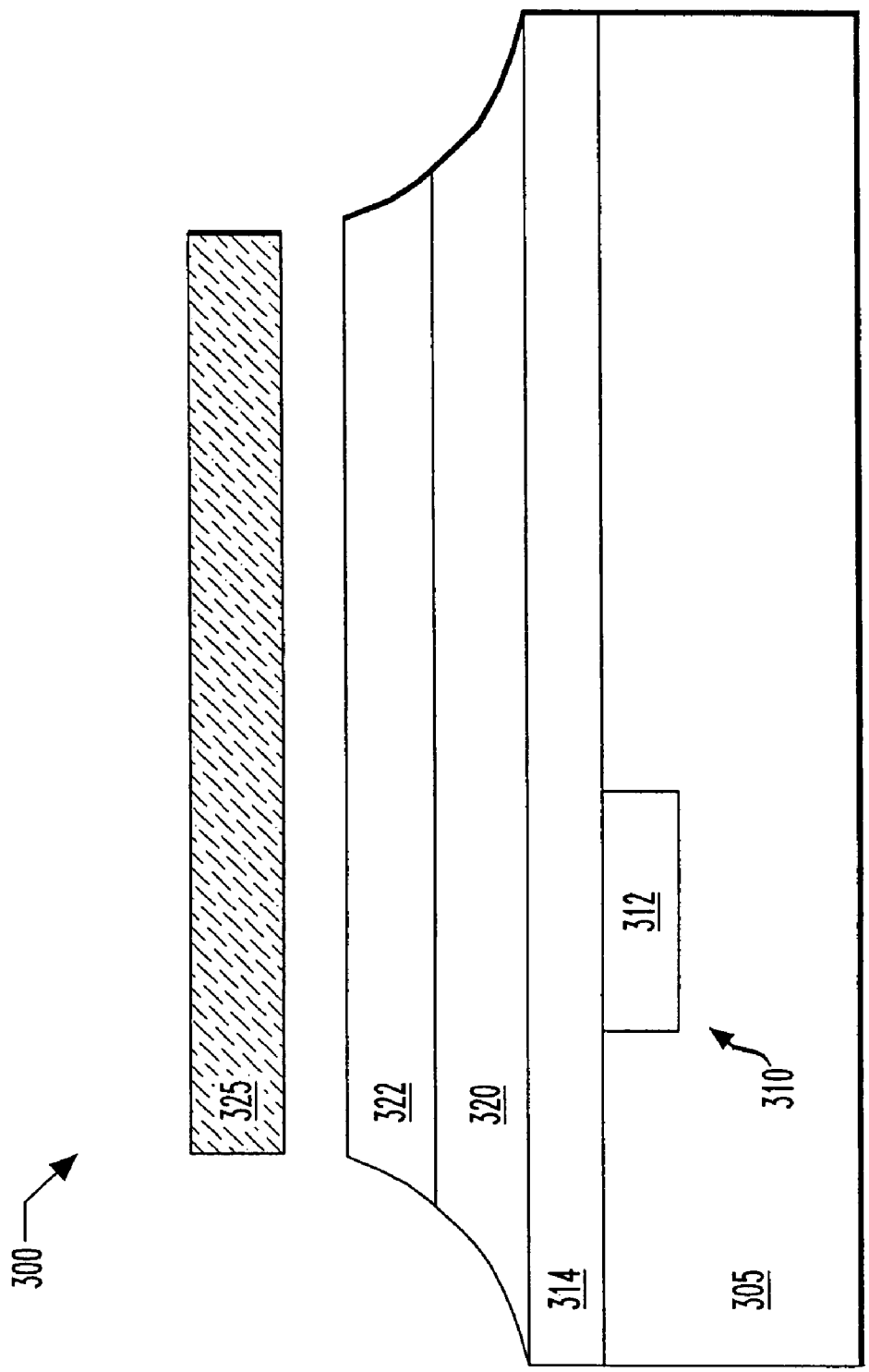
Figure 3F:
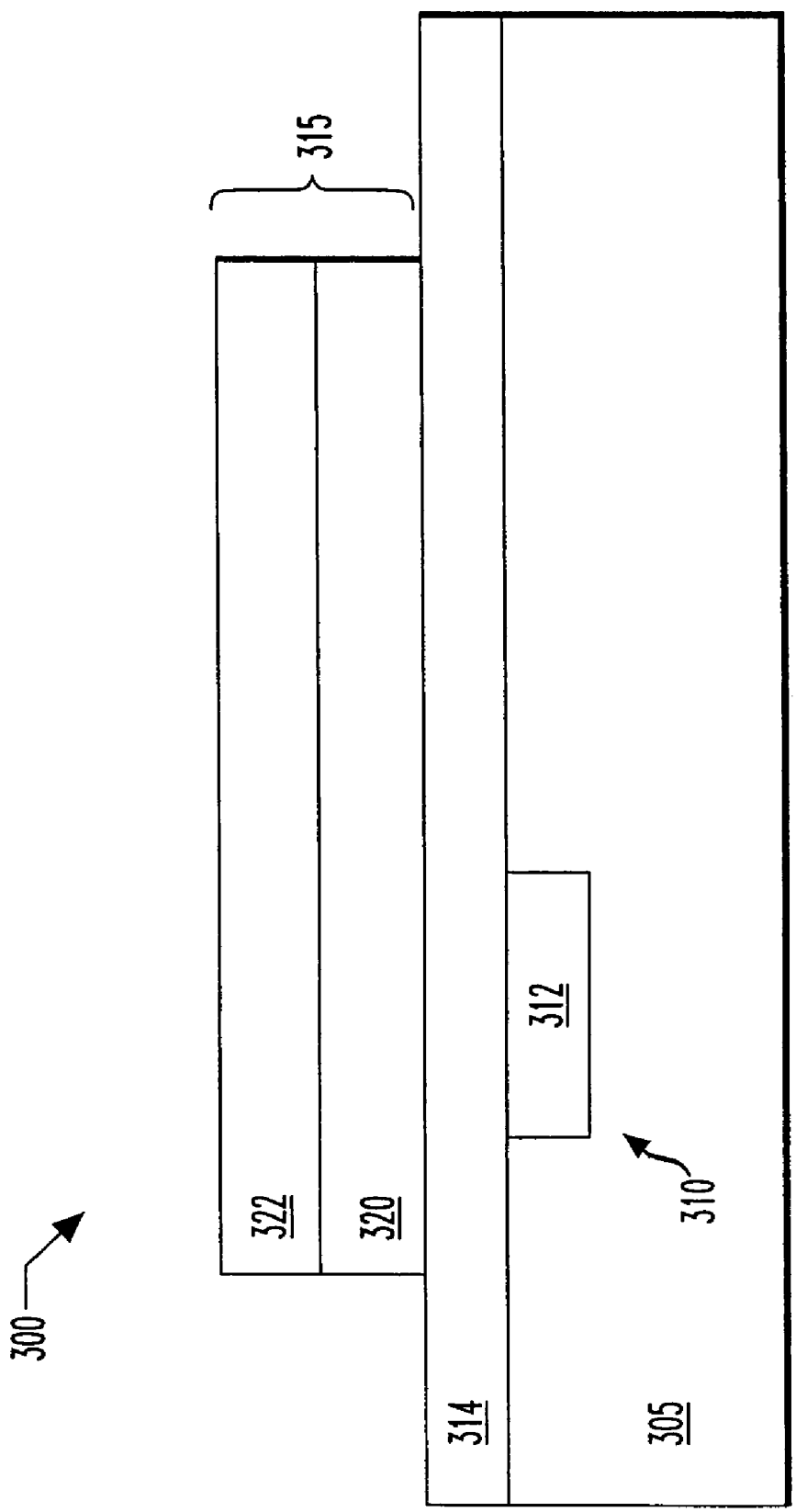

Referring to FIG. 3D, illustrated is the partially completed structure 300 after providing an etch-mask 325 over the p-type and n-type organic semiconducting layers 320, 322. The etch-mask 325 may, for example, be a standard photoresist mask that is lithographically formed on the top surface of the semiconductor layer 322. The etch-mask 325 may also be a hard shadow-mask that is simply positioned over the region to be protected from the etchant. FIG. 3E shows the partially completed structure 300 during etching both of the organic semiconducting layers 320, 322 together under the control of the single etch-mask 325. Portions of both of the organic semiconducting layers 320, 322, which are not protected by the etch-mask 325, are removed during the etch. The uses a conventional technique, such as oxygen plasma dry etching, to produce the stack 315, as depicted in FIG. 3F.

Figure 3G:
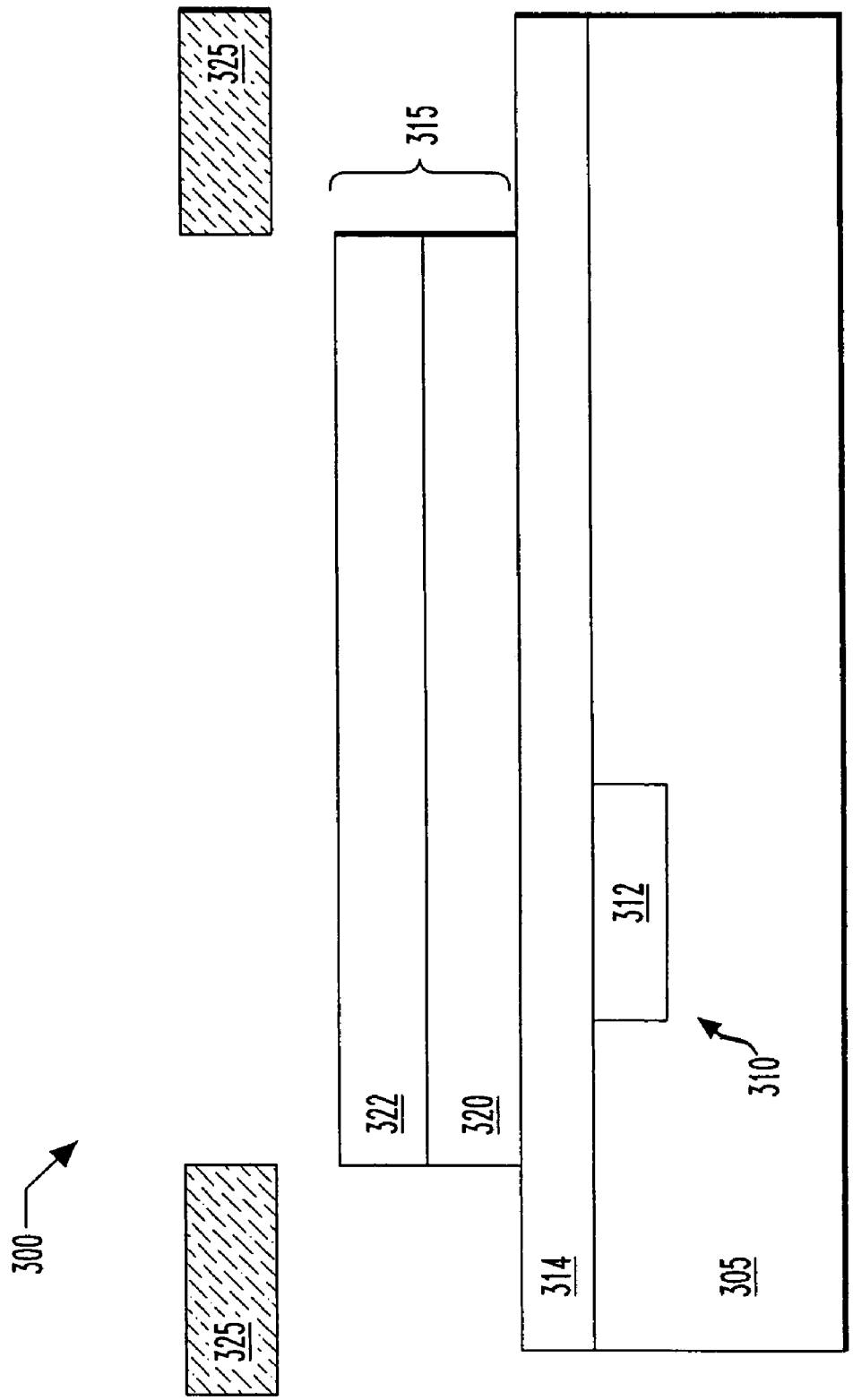

In other cases, as illustrated in FIG. 3G, the stack 315 can be formed by placing a deposition mask 330 over the substrate 305. For example, the mask 330 may be a hard shadow mask positioned over the substrate 305. Then, the materials of the p-type and n-type organic semiconducting layers 320, 322 are deposited through an opening 332 in the deposit-mask 330, using the same kind of procedures as discussed in the context of FIG. 3D, to provide the stack 315, similar to that depicted in FIG. 3F.

Figure 3H:
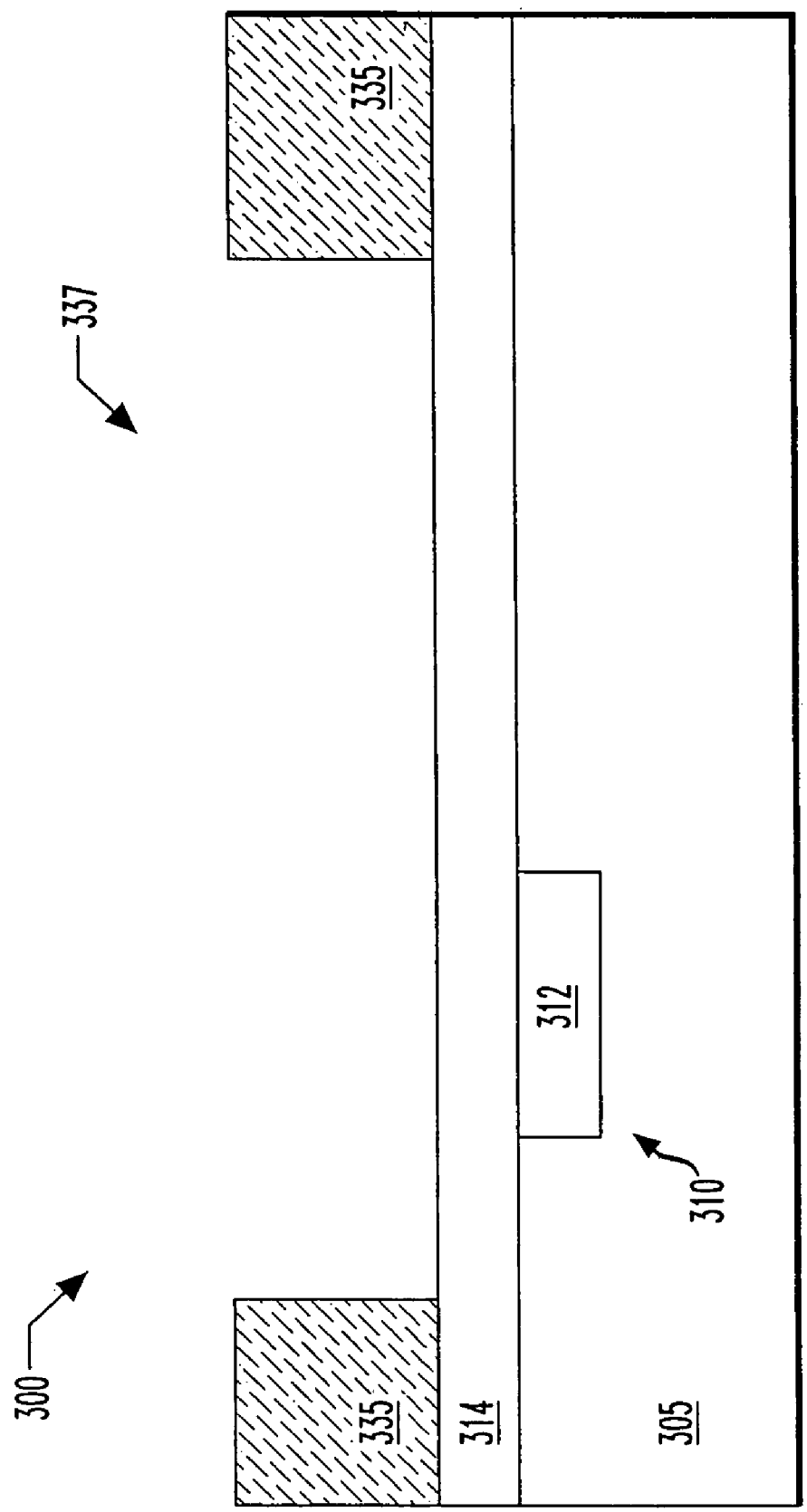
Figure 3I:
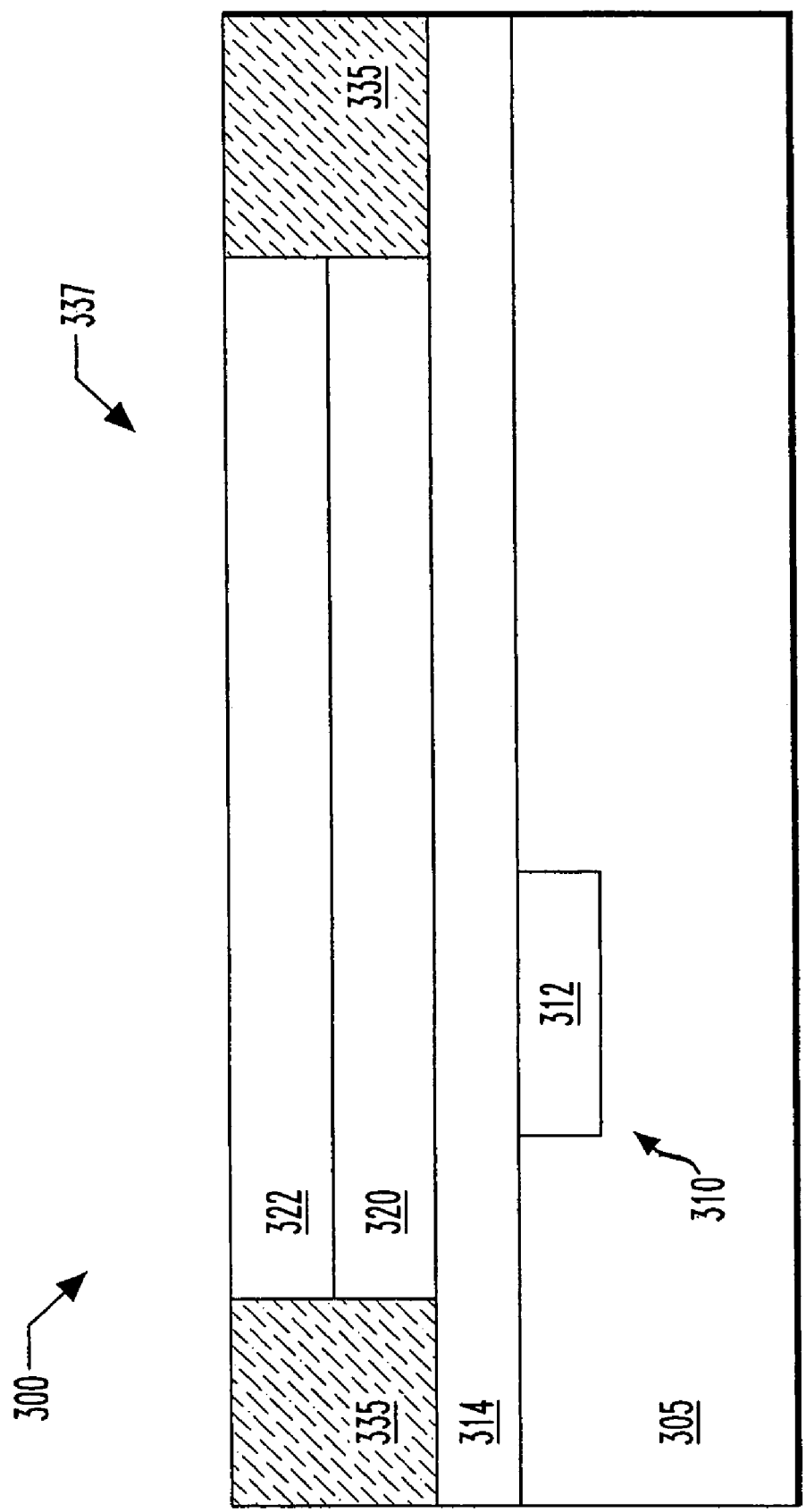

In still other cases, as illustrated in FIG. 3H, the stack 315 can be formed by providing a resist layer 335 over the substrate 305, the resist layer 335 having an opening 337 therein. The resist 335 can be made of any conventional material, such as photoresist, and conventional photolithography can be used to form the opening 337. Next, as illustrated in FIG. 3I, the p-type and n-type organic semiconducting layers 320, 322 are deposited through the opening 337. After depositing the organic semiconducting layers 320, 322 the resist layer 335 is removed to provide the stack 315 similar to that depicted in FIG. 3F.

The processes illustrated by FIGS. 3E-3I may be advantageous due to the need for only a single mask to produce both semiconductor layers 320, 322. The use of a single mask may make the process less expensive and/or simpler than other processes that require two masks to produce an inverter structure 300. In the inverter structure 300, the disposition of the semiconductor layers 320, 322 in a vertical stack enables one mask to be used to form both layers 320, 322.

Other processes, within the scope of the present invention, of forming the stack 315 will be readily apparent to those of ordinary skill in the art. For instance, another possible fabrication process involves laminating two different substrates 305 each containing one of the organic semiconducting layers 320, 322.

Figure 3J:
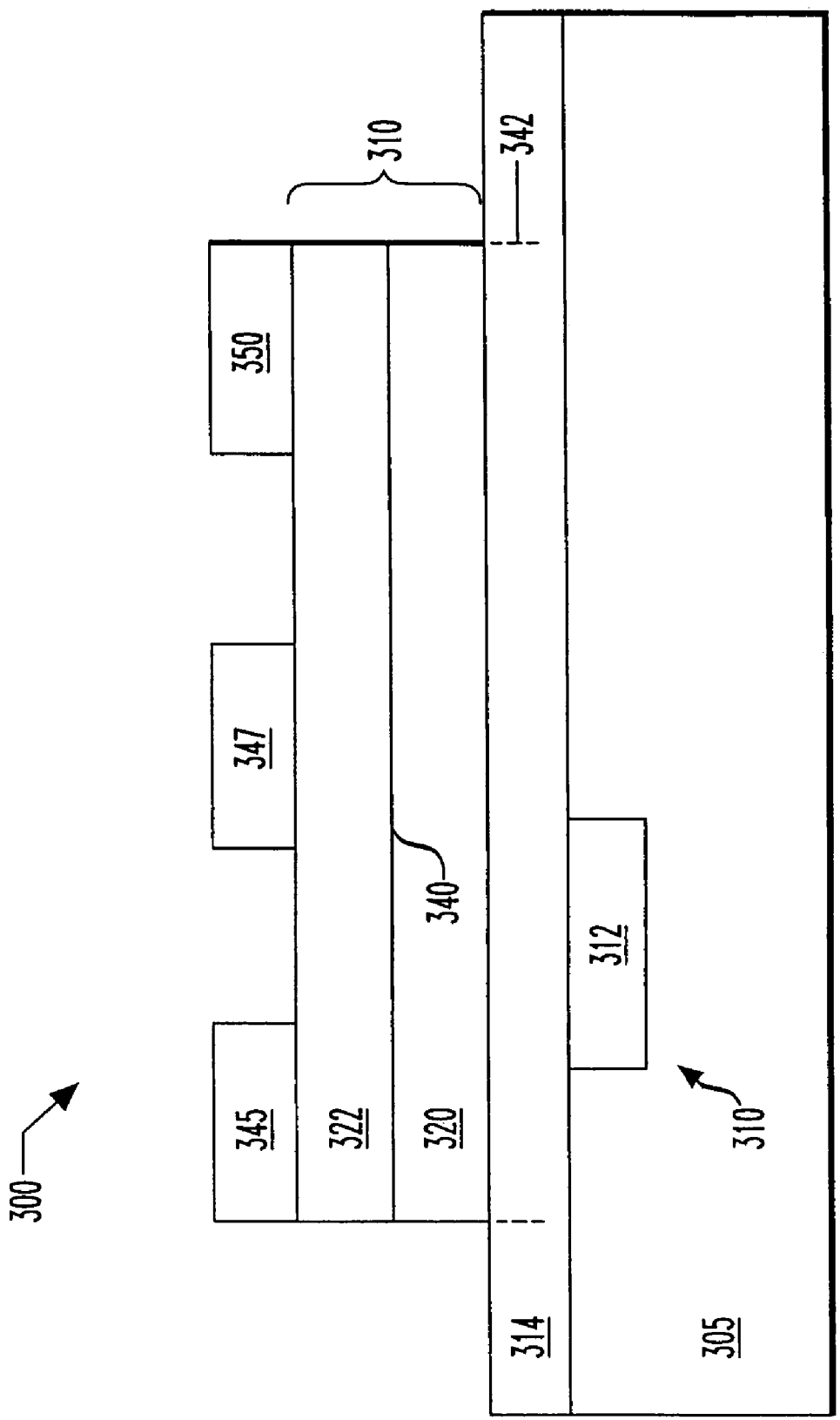

FIG. 3J shows the partially completed dual OFET structure 300 after forming the stack 315. Regardless of which of the above, or other procedure, is used to form the stack 315, the p-type and n-type organic semiconducting layers 320, 322 are in contact along an interface 340. As noted above, the formation of a smooth interface 340 is facilitated by depositing the one organic semiconductor layer 320, 322 that provides a lower surface roughness and larger grain size. In preferred embodiments, the n-type and n-type organic semiconductor layers 320, 322 are deposited sequentially using the same procedure, and therefore the layers 320, 322 of the stack 315 have substantially a same footprint 342.

With continuing reference to FIG. 3J, also shown is the partially completed dual OFET structure 300 after forming source and drain 345, 347 on one of the organic semiconducting layers 322. The source and drain 345, 347 can comprise the same or different materials, and be formed using the similar or different processes as described above for the first gate electrode 312. The source and drain 345, 347 are in contact with one of the semiconductor layers, in this case layer 322. As depicted in FIG. 3J, in certain preferred embodiments, when the dual OFET structure 300 is an inverter, a third gate electrode 350 is formed on the organic semiconducting layer 322, to provide an additional source or drain.

Figure 3K:
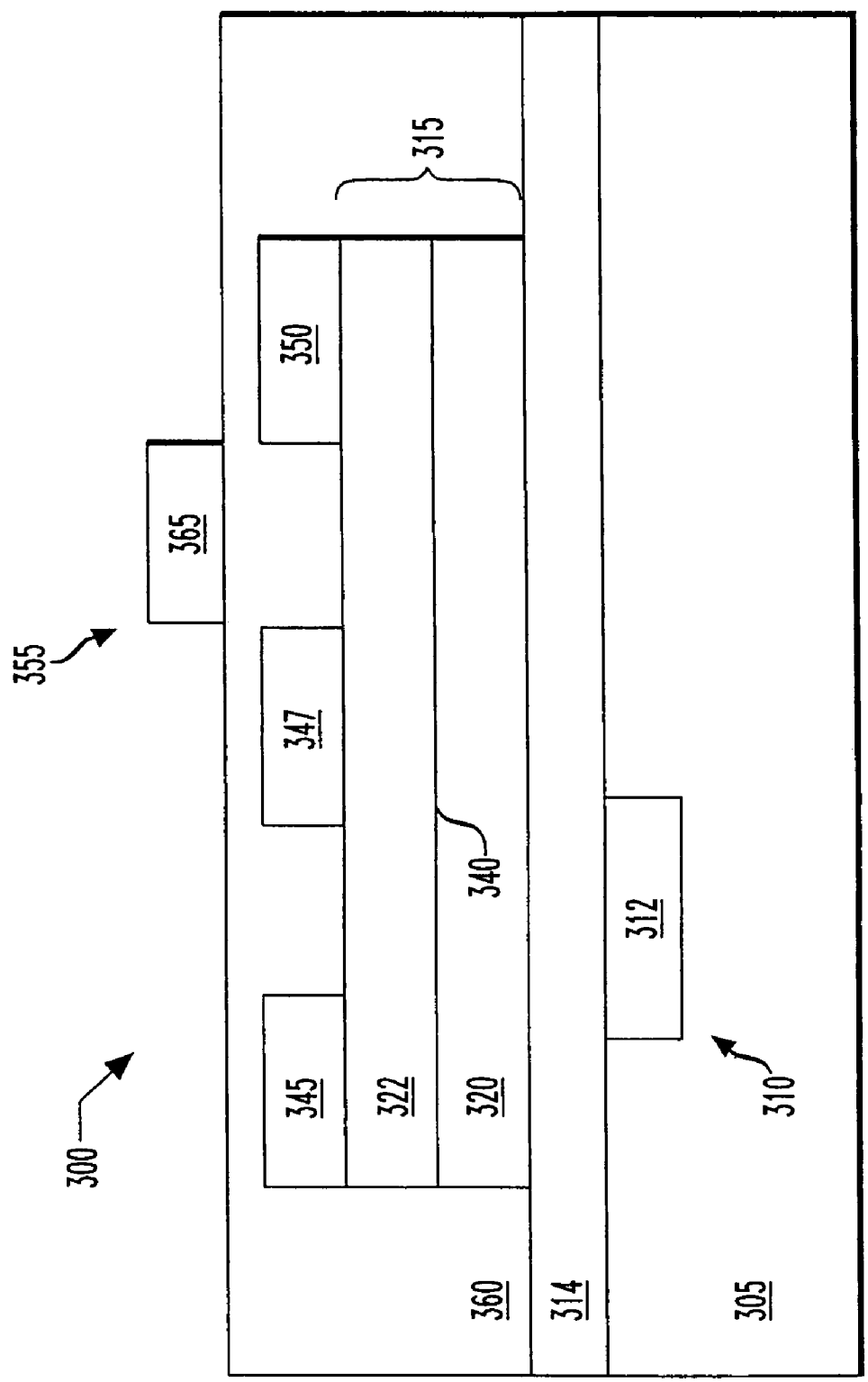

Turning now to FIG. 3K, shown is the partially completed dual OFET structure 300 after forming a second gate structure 355, comprising a second gate dielectric 360 and a second gate electrode 365 on the opposite side of the stack 315 as the first gate structure 310. The second gate dielectric and second gate electrode 360, 365 can be formed by the same or different procedures as discussed above for the first gate electrode and dielectric 312, 314. As further illustrated in FIG. 3K, in embodiments where the dual OFET structure 300 is an inverter, it is preferable for the first gate structure 310 to be between the source 345 and the drain 347, and for the second gate structure 355 to be between said drain electrode 347 and the third electrode 350.

It is advantageous for the second gate dielectric 360 to be formed using procedures that do not degrade the organic semiconductor layers 320, 322. For instance, it desirable for the second gate dielectric 360 to be made of paralyne, as this insulator can be deposited at a temperature of less than about 25° C., thereby avoided the heat-induced distortions of the organic semiconductor layers 320, 322. Moreover, because paralyne can be formed directly from a gaseous monomer, the organic semiconductor layers 320, 322 are not exposed to solvents that could dissolve these layers.

Although the present invention has been described in detail, those of ordinary skill in the art should understand that they can make various changes, substitutions and alterations herein without departing from the scope of the invention.

What is claimed is:

1. A method for fabricating a dual organic field effect transistor (OFET) structure, comprising:
   forming a first gate structure on a substrate;
   forming a stack over said first gate structure and over said substrate, said stack comprising a p-type organic semiconducting layer and an n-type organic semiconducting layer, said organic semiconducting layers being in contact along an interface;
   forming a source electrode and a drain electrode; and
   forming a second gate structure on an opposite side of said stack as said first gate structure; and
   wherein said source and drain electrodes are in contact with one of said organic semiconductor layers, wherein said first gate structure is configured to control a channel region of said n-type organic semiconductor layer, and said second gate structure is configured to control a channel region of said p-type organic semiconductor layer.

2. The method as recited in claim 1, wherein said source and drain electrodes contact only one of said organic semiconductor layers, wherein at least one of said source and drain electrodes is a source or drain electrode for a channel in said n-type organic semiconductor layer and for a channel in said p-type organic semiconductor layer.

3. The method as recited in claim 1, wherein said n-type organic semiconductor layer and said p-type organic semiconductor layer have substantially a same footprint.

4. The method as recited in claim 1, wherein said interface has a surface roughness of less than about 50 nanometers.

5. The method as recited in claim 1, wherein forming said stack comprises:
   depositing said p-type organic semiconducting layer and said n-type organic semiconducting layer over said substrate;
   providing an etch-mask over said p-type organic semiconducting layer and said n-type organic semiconducting layer; and
   etching both of said organic semiconducting layer under control of the etch-mask, to remove portions of both of said organic semiconducting layer.

6. The method as recited in claim 1, wherein forming said stack comprises:
   providing a mask over said substrate; and
   depositing said p-type organic semiconducting layer and said n-type organic semiconducting layer through an opening in said mask.

7. The method as recited in claim 1, wherein forming said stack comprises:
   providing a resist layer over said substrate, said resist layer having an opening therein;
   depositing said p-type organic semiconducting layer and said n-type organic semiconducting layer through said opening; and
   removing said resist layer.

8. The method as recited in claim 1, wherein forming said source and drain electrodes further includes forming a third electrode on said one of said organic semiconducting layers, wherein said first gate structure is in between said source electrode and said drain electrode, and said second gate structure is in between said drain electrode and said third electrode.

9. The method as recited in claim 1, further includes:
   forming a first dielectric layer in between said stack and said first gate electrode; and
   forming a second dielectric layer in between said stack and said second gate electrode,
   wherein at least one of said first or second dielectric layers are deposited after forming said stack using a solvent free process at a temperature of less than about 25° C.

* * * * *